United States Patent
Lai et al.

(10) Patent No.: US 6,944,809 B2
(45) Date of Patent: Sep. 13, 2005

(54) METHODS OF RESOURCE OPTIMIZATION IN PROGRAMMABLE LOGIC DEVICES TO REDUCE TEST TIME

(75) Inventors: Andrew W. Lai, Fremont, CA (US); Randy J. Simmons, San Jose, CA (US); Teymour M. Mansour, Sunnyvale, CA (US); Vincent L. Tong, Fremont, CA (US); Jeffrey V. Lindholm, Longmont, CO (US); Jay T. Young, Louisville, CO (US); William R. Troxel, Longmont, CO (US); Sridhar Krishnamurthy, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 497 days.

(21) Appl. No.: 10/214,025

(22) Filed: Aug. 6, 2002

(65) Prior Publication Data

US 2004/0030975 A1 Feb. 12, 2004

(51) Int. Cl.[7] ............................................. G01R 31/28
(52) U.S. Cl. ....................................... 714/725; 714/724
(58) Field of Search .......................... 712/37; 713/310; 326/38; 714/725, 724; 716/4

(56) References Cited

U.S. PATENT DOCUMENTS

| | | | | |
|---|---|---|---|---|
| 6,148,390 A | * | 11/2000 | MacArthur et al. | ............ 712/37 |
| 6,188,242 B1 | | 2/2001 | Mahajan et al. | |
| 6,347,378 B1 | * | 2/2002 | MacArthur et al. | .......... 713/310 |
| 6,466,050 B1 | * | 10/2002 | Mohammed et al. | .......... 326/38 |
| 6,539,508 B1 | * | 3/2003 | Patrie et al. | ................. 714/726 |
| 6,687,884 B1 | * | 2/2004 | Trimberger | ..................... 716/4 |
| 6,809,551 B1 | * | 10/2004 | Wicker, Jr. | .................... 326/41 |

FOREIGN PATENT DOCUMENTS

WO    WO 01/41309 A1    6/2001

OTHER PUBLICATIONS

John Emmert et al.; "Dynamic Fault Tolerance in FPGAs via Partial Reconfiguration"; Apr. 17, 2000; Annual IEEE Symposium on Field–Programmable Custom Computing Machines; XP002196502; pp. 165–174.

* cited by examiner

Primary Examiner—David Ton
(74) Attorney, Agent, or Firm—Lois D. Cartier

(57) ABSTRACT

Methods of optimizing the use of routing resources in programmable logic devices (PLDs) to minimize test time. A set of routing resources is identified that are not used in most designs, and a device model is provided to the user that prevents the use of these resources. Because the routing resources will never be used, they need not be tested by the PLD manufacturer, significantly reducing the test time. For example, each PLD within a PLD family is typically designed using a different number of similar tiles. Thus, smaller PLDs in the family include an unnecessarily large number of routing resources. These excessive routing resources can be disabled during implementation of a design. In another example, each tile along the edges of an array includes routing resources designed primarily to provide access to tiles that are not present. These redundant routing resources can be disabled during implementation of a design.

19 Claims, 4 Drawing Sheets

METHODS OF RESOURCE OPTIMIZATION IN PROGRAMMABLE LOGIC DEVICES TO REDUCE TEST TIME

FIELD OF THE INVENTION

The invention relates to Programmable Logic Devices (PLDs). More particularly, the invention relates to methods of reducing test time in PLDs by eliminating the necessity for testing redundant resources.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic elements (CLEs) accessed from off-chip via programmable input/output blocks (IOBs). The CLEs and IOBs are interconnected by a programmable interconnect structure. Some FPGAs also include additional logic blocks with special purposes (e.g., DLLs, RAM, and so forth).

The interconnect structure, CLEs, IOBs, and other logic blocks are typically programmed by loading a stream of configuration data (bitstream) into internal configuration memory cells that define how the CLEs, IOBs, and interconnect structure are configured. The configuration data can be read from memory (e.g., an external PROM) or written into the FPGA by an external device. The collective states of the individual memory cells then determine the function of the FPGA.

The interconnect structure typically includes a large number of routing resources such as interconnect lines (e.g., metal wires) running generally horizontally and vertically between the various logic blocks, and programmable interconnect points (PIPs) that selectively couple the interconnect lines to each other and to input and output pins of the logic blocks. Interconnect lines within the CLE array can span, for example, one CLE, two CLEs, six CLEs, half of the chip, and so forth. By enabling selected PIPs, two signals in two logic blocks can be interconnected via one or more of the interconnect lines.

In order to test a PLD, typically every logic block, every interconnect line, and every PIP must be tested. This exhaustive testing process is required because, being a programmable device, the manufacturer cannot predict which of the literally millions of resources will be used by a customer's design. For some PLDs, the process of testing every resource on the device can be so time-consuming that testing becomes the largest expense in producing the PLD—larger than the cost of fabricating the die. Therefore, it is desirable to reduce PLD testing time as much as possible.

PLD providers typically offer a "family" of PLD products, that is, a set of PLDs that are closely related but include different numbers of similar logic blocks. A rectangular area (i.e., a "tile") is designed and laid out that includes, for example, a CLE and the associated routing resources. The CLE can include, for example, one or more lookup tables and one or more memory elements paired with the lookup tables. The routing resources can include, for example, interconnect lines that connect by abutment with interconnect lines in adjacent tiles. The routing resources also include PIPs that allow signals access to and from the interconnect lines and CLEs.

Typically, a single tile is designed (e.g., including a CLE and the associated routing) and this single tile is used in the CLE arrays of all members of a PLD family. For example, the smallest member of a PLD family can include an 8×8 array of tiles, while the largest member of the same family can include a 128×120 array of the same tiles. Each of these tiles is similar, i.e., has the same number of resources located in about the same positions within the tile, although minor variations can occur in edge tiles, for example, to improve the layout area of the PLD or for other reasons. The number of interconnect resources provided within the tile is typically sized to accommodate the number of signals required by the largest array of tiles.

It is well known that the required number of interconnect resources grows at a rate larger than the number of tiles. Therefore, for example, if N interconnect lines per tile are sufficient to route a typical design in an 8×8 array, many more than N interconnect lines per tile are required to route a typical design in a 128×120 array. Similarly, for example, if M interconnect lines per tile are sufficient to route 90% of user designs in the 128×120 array, probably all user designs will route quickly within the smaller array having M interconnect lines per tile. Large numbers of interconnect lines and PIPs typically go unused in the smaller arrays.

A similar condition applies at the edges of each array, and particularly at the corners, regardless of the size of the array. Because of the uniformity of the tiles, the same number of interconnect lines per tile are available at the outer edges of the array as in the center of the array. However, signals are typically much more congested in the center of the array. Therefore, large numbers of interconnect lines and PIPs typically go unused in the outer tiles, and especially in the edge tiles.

Further, certain types of interconnect lines and PIPs are always unused in edge tiles, such as those used to connect directly to an adjacent tile that is not present because the edge of the array has been reached. Other types of interconnect lines and PIPs are very rarely used at the edges of an array, such as those generally used to route signals long distances in the direction of the edge.

Using similar tiles (and especially using uniform tiles) in the design of PLDs reduces the PLD design time, increases product yield due to the uniformity of the circuit structure, simplifies the implementation software for the PLD, and allows for many consistent timing specifications across the PLD family. However, this uniformity of design also leads to uniformity of testing.

In other words, each tile in the smaller members of the PLD family is typically tested just as exhaustively as tiles in larger members of the same PLD family, and each tile at the edges of the tile array is equally exhaustively tested.

Testing time for PLDs is an important issue not only in larger PLDs, but also in smaller PLDs, which typically include excessive routing resources and in which a larger percentage of the tiles are edge tiles and corner tiles. Therefore, it is desirable to reduce testing time for all PLDs in which arrays of similar tiles are used.

SUMMARY OF THE INVENTION

The invention provides methods of optimizing the use of routing resources in programmable logic devices. (PLDs) to minimize test time. A set of routing resources is identified that are not used in most designs, and a device model is provided to the user that prevents the use of these resources. Because the routing resources will never be used, they need not be tested by the PLD manufacturer. The end result is a significantly faster test time, which allows the PLD manufacturer to reduce the price of the PLDs. The methods are also useful for eliminating routing resources that are difficult to test, in order to improve test coverage.

For example, each PLD within a PLD family is typically designed using a similar tile, with the various PLDs including different numbers of the similar tiles. Thus, smaller PLDs in,the family include an unnecessarily large number of routing resources. Sometimes, even the largest member of a PLD family proves to include excessive routing resources. According to one aspect of the invention, these excessive routing resources are disabled during implementation of a user design.

In another example, each tile includes routing resources designed to access tiles (particularly adjacent tiles) in each of the four compass directions. Some PLDs also provide "direct connect" routing resources to diagonally adjacent or nearby tiles. In either case, tiles along the edges of a tile array include routing resources designed primarily to provide access to tiles that are not present. According to one aspect of the invention, these redundant routing resources are disabled during implementation of a user design.

According to some embodiments, a method of reducing test time includes identifying a first set of routing resources that are not to be used in a target PLD, supplying a device model to users that specifies the first set of routing resources as inaccessible, and generating a set of test patterns for the target PLD that do not test the first set of routing resources. Some embodiments include the further step of testing the target PLD using the set of test patterns.

According to other embodiments, a method of implementing a design in a PLD includes identifying a target PLD for the design, reading a device model for the target PLD, where the device model specifies a first set of routing resources that are not to be used in the target PLD, and implementing the design in the target PLD using the device model to ensure that the first set of routing resources are not used.

According to yet other embodiments, a method of enabling the implementation of user designs applies to first and second PLDs within a PLD family that includes variouslysized arrays of similar tiles. The method includes identifying first and second sets of routing resources that are not to be used in the first and second PLDs, storing in first and second device models data specifying the first and second sets of routing resources as inaccessible, and supplying the first and second device models to a user. In one embodiment, the first PLD is smaller than the second PLD and the first set of routing resources is larger than the second set. Thus, excess routing resources included in the tile but not needed in the smaller PLD are inaccessible to the user and need not be tested.

According to some embodiments, a method of enabling the implementation of user designs includes identifying, for each tile located on an edge of the array, a set of routing resources that are designed to provide access to tiles not present for the instant tile, storing in a device model data specifying the identified sets of routing resources as inaccessible, and supplying the device model to a user.

BRIEF DESCRIPTION OF THE DRAWINGS

The present invention is illustrated by way of example, and not by way of limitation, in the following figures.

DETAILED DESCRIPTION OF THE DRAWINGS

The present invention provides a variety of methods applicable to the design and testing of programmable logic devices (PLDs). The present invention has been found to be particularly applicable and beneficial for field programmable gate arrays (FPGAs). However, the present invention is not so limited.

Further, the methods of the present invention can be performed in either hardware, software, or any combination thereof, as those terms are currently known in the art. In particular, the present methods can be carried out by software, firmware, or microcode operating on a computer or computers of any type. Additionally, software embodying the present invention may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform.

Figure 1:
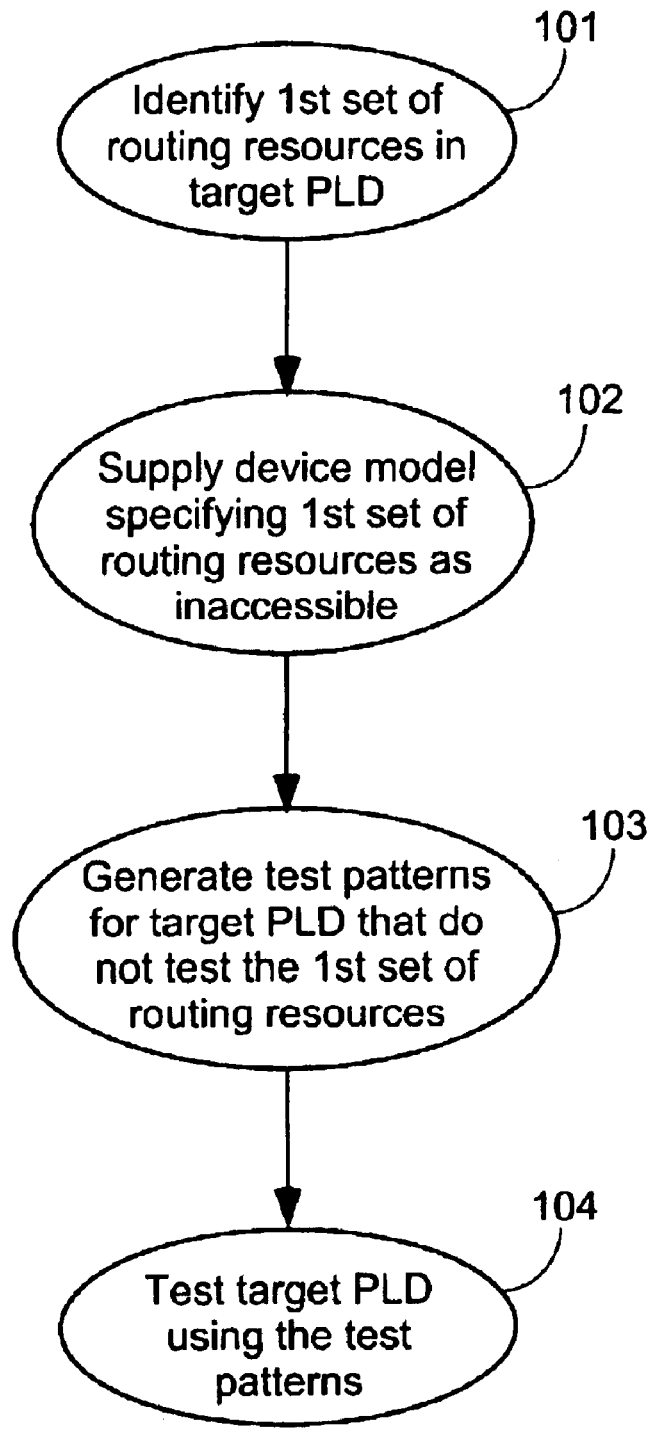
FIG. 1 illustrates a method of reducing test time for a PLD according to one embodiment of the invention.

FIG. 1 shows the steps of a method for reducing test time in PLDs. In step 101, a first set of routing resources is identified in the target PLD that will not be used in implementing user designs. The first set of routing resources can include, for example, programmable interconnect points (PIPs) and/or interconnect lines that are rarely or never used in user designs. These routing resources can sometimes be identified by logical inference, as in the case of PIPs in edge tiles that are primarily designed to interface with adjacent tiles not present. (An edge tile can be a tile along the outer edge of the complete tile array, or a tile adjacent to a different logic block inserted into the array, such as a block RAM.) When logical inference is used to identify redundant routing resources, it is desirable (but not mandatory) to test the logical inference by ensuring that most or all user designs still route without these identified resources.

Alternatively or additionally, an analysis can be made of a suite of previously implemented user designs that identifies resources rarely or never used by the implementation software.

The first set of routing resources can also (or alternatively) include excess resources that are not needed in a particular PLD. For example, a small PLD that uses a tile designed for a large PLD will include an unnecessarily large number of routing resources, as described in the Background section, above. For the small PLD, some of these routing resources can be included in the first set of routing resources, thereby identifying them as resources that will not be used. For the largest member of the PLD family, the tile is presumably appropriately sized to include the correct number of routing resources. Therefore, for the largest member of the PLD family, these routing resources are preferably not included in the first set of routing resources. When excess routing resources are included in the first set of routing resources, it is desirable (but not mandatory) to test a large number of designs and ensure that most or all of the designs still route, given the reduced number of available routing resources.

In step 102, a device model (e.g., a computer file including data regarding the programmable resources in the target PLD) is supplied to one or more users, where the device model specifies as inaccessible the first set of routing resources. Because they are marked as inaccessible in the device model, the implementation software treats all routing resources in the first set of resources as if they do not exist.

In step 103, a set of test patterns is generated that is smaller than a full set of test patterns required to test every routing resource in the PLD. The number or size of test patterns is reduced because the resources specified as inaccessible in the device model are not tested.

In step 104, which can be performed, for example, by the PLD manufacturer or at a separate testing facility, the PLD is tested using the set of test patterns provided in step 103.

Figure 2:
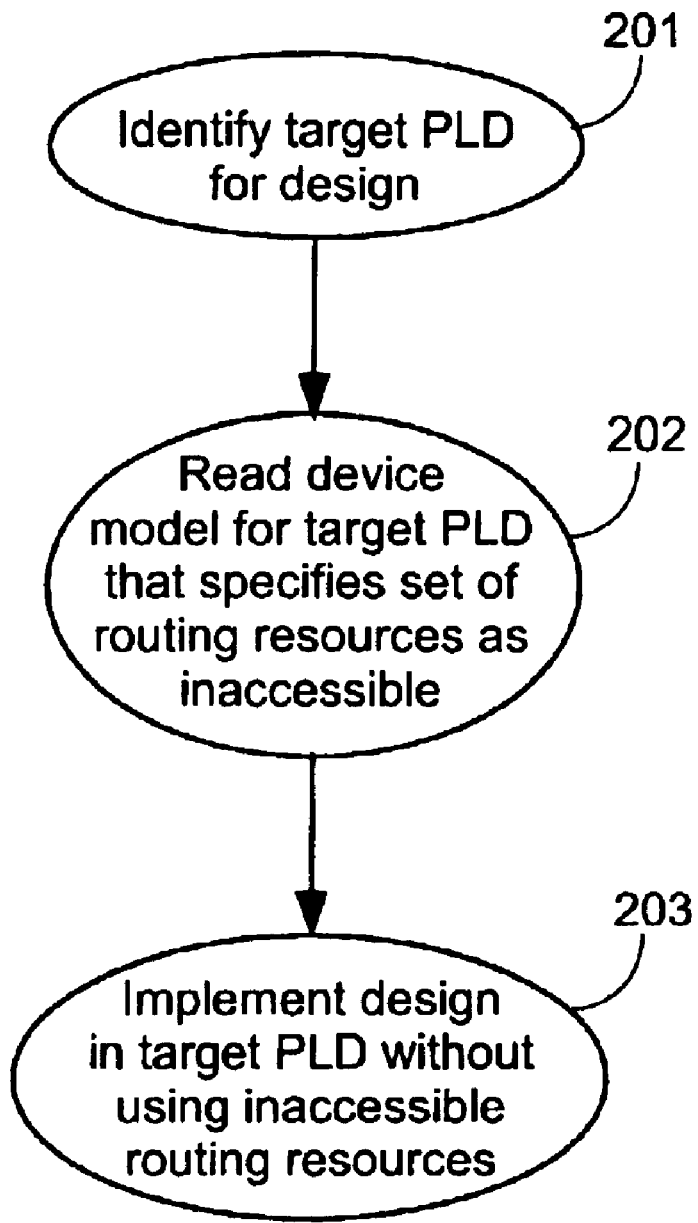
FIG. 2 illustrates a method of implementing a design in a PLD according to one embodiment of the invention.

FIG. 2 shows the steps of a method of implementing a design in a PLD. In step 201, a target PLD is identified in which the design will be implemented. For example, based on an estimate of resources required to implement the design, a PLD can be selected from a family of available PLDs that is sufficiently large to hold the design but not larger than necessary. In step 202, a device model for the target PLD is read. The device model specifies, possibly among other data, a set of routing resources that is marked as inaccessible, i.e., not to be used in implementing the design. The routing resources specified as inaccessible can be selected, for example, using any of the methods described above with relation to FIG. 1.

In step 203, the design is implemented in the target PLD using the device model. The routing resources specified as inaccessible in the device model are not used to implement the design.

Figure 3:
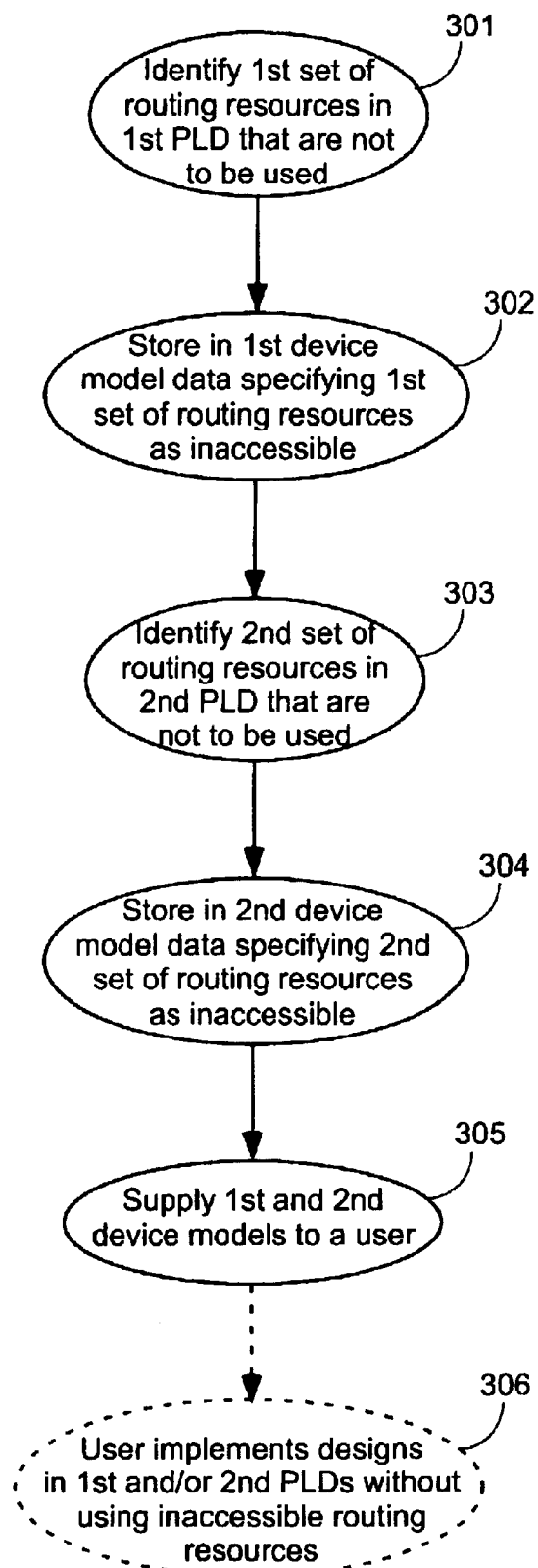
FIG. 3 illustrates a method of enabling the implementation of user designs in a family of PLDs according to one embodiment of the invention.

FIG. 3 shows the steps of a method of enabling the implementation of user designs in a family of PLDs. The family of PLDs includes at least two PLDs, each including a differently-sized array of a similar tile. In step 301, a first set of routing resources is identified in the first PLD that will not be used when implementing user designs in the first PLD. The first set of routing resources can be identified, for example, using any of the methods described above with relation to FIG. 1. In step 302, data identifying the first set of routing resources is stored in a first device model for the first PLD.

In step 303, a second set of routing resources is identified in the second PLD that will not be used when implementing user designs in the second PLD. The second set of routing resources can be identified, for example, using any of the methods described above with relation to FIG. 1. The first and second sets of routing resources are not identical, because the first and second PLDs include differently-sized arrays of tiles. In step 304, data identifying the second set of routing resources is stored in a second device model for the second PLD.

Clearly, steps 301–304 can be performed in an order other than that shown. For example, step 303 (or steps 303 and 304) can be performed prior to step 302.

In step 305, the first and second device models are supplied to one or more users. For example, the first and second device models can be included with a software package that implements a user design, e.g., place and route software that supports the family of PLDs. As another example, one or more of the device models can be supplied to a user as a software enhancement, e.g., as a file transferred over the Internet.

In step 306, a user implements a design in one or both of the first and second PLDs, where the implementation software uses the first and/or second device models to ensure that the routing resources specified as inaccessible are not used.

Figure 4:
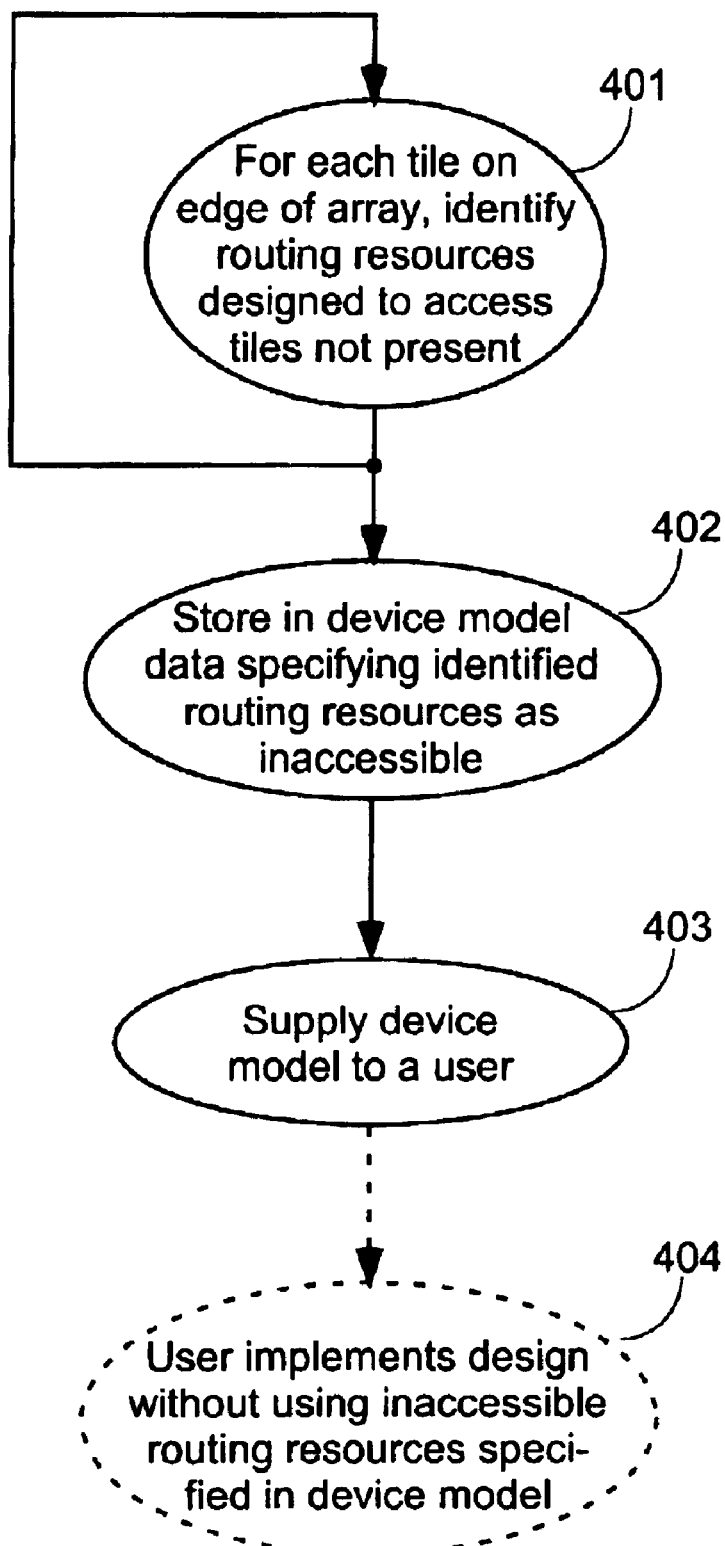
FIG. 4 illustrates a method of enabling the implementation of user design in a PLD according to one embodiment of the invention.

FIG. 4 shows the steps of a method of enabling the implementation of user design in a PLD. The PLD includes an array of similar tiles. In step 401, for each tile around the edge of the array, routing resources are identified that are primarily intended to provide access to tiles that are not present, i.e., tiles that would have been beyond the edge of the array.

In step 402, data is stored in a device model that specifies as inaccessible the routing resources identified in step 401. In step 403, the device model is supplied to a user. For example, the device model can be included with a software package, or supplied as a single file. In step 404, the user implements the design without using the routing resources specified as inaccessible in the device model.

Those having skill in the relevant arts of the invention will now perceive various modifications and additions that may be made as a result of the disclosure herein. Accordingly, all such modifications and additions are deemed to be within the scope of the invention, which is to be limited only by the appended claims and their equivalents.

What is claimed is:

1. A method of reducing test time for a target programmable logic device (PLD) that includes an array of similar tiles each including similar routing resources, the method comprising:

identifying a first set of routing resources present in the target PLD that are not to be used in implementing user designs;

supplying a device model for the target PLD to one or more users, the device model specifying as inaccessible the first set of routing resources; and generating a set of test patterns for the target PLD that do not test the first set of routing resources.

2. The method of claim 1, wherein identifying the first set of routing resources comprises identifying routing resources that are infrequently used in user designs.

3. The method of claim 1, wherein identifying the first set of routing resources comprises identifying routing resources designed to provide access to tiles not present along edges of the array.

4. The method of claim 1, wherein:

the target PLD is a member of a family of PLDs including differently-sized arrays of the tiles;

the target PLD is not the largest member of the family of PLDs; and identifying the first set of routing resources comprises identifying routing resources not identified in corresponding tiles of the largest member of the family of PLDs.

5. The method of claim 1, wherein the routing resources comprise interconnect lines and programmable interconnect points (PIPs).

6. The method of claim 1, further comprising testing the target PLD using the set of test patterns.

7. The method of claim 1, wherein generating a set of test patterns for the target PLD comprises generating a set of test patterns for the target PLD that tests all routing resources in the target PLD except the first set of routing resources.

8. The method of claim 1, wherein the target PLD is a field programmable gate array (FPGA).

9. A method of implementing a design in a programmable logic device (PLD), the PLD including an array of similar tiles each including similar routing resources, the method comprising:

identifying a target PLD in which the design will be implemented;

reading a device model for the target PLD, the device model specifying as inaccessible a set of routing resources present in the PLD that are not to be used in implementing the design; and implementing the design in the target PLD using the device model, wherein the routing resources specified as inaccessible in the device model are not used, wherein the device model specifies routing resources within the target PLD that are infrequently used in user designs.

10. The method of claim 9, wherein the device model specifies routing resources designed to provide access to tiles not present along edges of the array.

11. The method of claim 9, wherein:

the target PLD is a member of a family of PLDs including differently-sized arrays of the tiles;

the target PLD is not the largest member of the family of PLDs; and the device model specifies routing resources not specified in a corresponding device model for the largest member of the family of PLDs.

12. The method of claim 9, wherein the routing resources comprise interconnect lines and programmable interconnect points (PIPs).

13. The method of claim 9, wherein the target PLD is a field programmable gate array (FPGA).

14. A method of enabling the implementation of user designs in programmable logic devices (PLDs) included in a family of PLDs, the family of PLDs including variously-sized arrays of similar tiles each including similar routing resources, the method comprising:

identifying a first set of routing resources present in a first PLD that are not to be used in implementing user designs;

storing in a first device model data specifying as inaccessible the first set of routing resources for the first PLD;

identifying a second set of routing resources present in a second PLD that are not to be used in implementing user designs, wherein the first and second PLDs are differently-sized members of the family of PLDs, and wherein the first and second sets of routing resources are not identical;

storing in a second device model data specifying as inaccessible the second set of routing resources for the second PLD; and supplying the first and second device models to one or more users, wherein the first and second device models are used to implement the user designs in the first and second PLDs without using the routing resources specified as inaccessible in the corresponding device models.

15. The method of claim 14, wherein the first PLD comprises a smaller array of the tiles than the second PLD.

16. The method of claim 15, wherein the first set of routing resources is larger than the second set of routing resources.

17. The method of claim 14, wherein the first and second PLDs are field programmable gate arrays (FPGAs).

18. A method of enabling the implementation of a user design in a programmable logic device (PLD), the PLD including an array of similar tiles each including similar routing resources, the method comprising:

for each tile located on an edge of the array, identifying a set of routing resources that are designed to provide access to tiles not present for the instant tile;

storing in a device model data specifying as inaccessible the identified sets of routing resources; and supplying the device model to a user, wherein the device model is used to implement the user design without using the routing resources specified as inaccessible in the device model.

19. The method of claim 18, wherein the PLD is a field programmable gate array (FPGA).

* * * * *